(12) United States Patent
Zanati et al.

(10) Patent No.: US 11,079,429 B2
(45) Date of Patent: Aug. 3, 2021

(54) ATE TESTING SYSTEM AND METHOD FOR MILLIMETRE WAVE PACKAGED INTEGRATED CIRCUITS

(71) Applicant: NXP B.V., Eindhoven (NL)

(72) Inventors: Abdellatif Zanati, Hamburg (DE); Holger Mahnke, Hohenwestedt (DE)

(73) Assignee: NXP B.V., Eindhoven (NL)

( * ) Notice: Subject to any disclaimer, the term of this patent is extended or adjusted under 35 U.S.C. 154(b) by 254 days.

(21) Appl. No.: 15/905,110

(22) Filed: Feb. 26, 2018

(65) Prior Publication Data

US 2018/0259574 A1 Sep. 13, 2018

(30) Foreign Application Priority Data

Mar. 7, 2017 (EP) ..................................... 17159572

(51) Int. Cl.
  *G01R 31/28* (2006.01)
  *G01R 1/04* (2006.01)
(52) U.S. Cl.
  CPC ......... *G01R 31/2886* (2013.01); *G01R 1/045* (2013.01); *G01R 31/2896* (2013.01); *G01R 31/2851* (2013.01)
(58) Field of Classification Search
  CPC ................ G01R 1/045; G01R 31/2851; G01R 31/2886; G01R 31/2896
  See application file for complete search history.

(56) References Cited

U.S. PATENT DOCUMENTS

| | | | |
|---|---|---|---|
| 4,980,636 A * | 12/1990 | Romanofsky | G01R 1/045 324/601 |
| 5,408,188 A | 4/1995 | Katoh | |
| 2003/0099097 A1 | 5/2003 | Mok et al. | |
| 2007/0269999 A1 | 11/2007 | Di Stefano | |
| 2010/0064265 A1* | 3/2010 | Inoue | G06F 30/367 716/136 |
| 2010/0244871 A1 | 9/2010 | Blair et al. | |
| 2012/0126821 A1 | 5/2012 | Forstner | |
| 2015/0048980 A1* | 2/2015 | Chin | G01R 1/045 343/703 |

(Continued)

FOREIGN PATENT DOCUMENTS

| | | |
|---|---|---|
| CN | 101131398 B | 6/2011 |
| EP | 0795936 A3 | 5/1998 |

OTHER PUBLICATIONS

Kimishima, M., "Introduction to Latest RF Test Technologies in RF ATE For Low Test Cost and High Throughput", CJMW Proceedings, 2011.

(Continued)

*Primary Examiner* — Son T Le
*Assistant Examiner* — Adam S Clarke

(57) ABSTRACT

An ATE testing system (900, 1000) for millimetre wave (mmW) packaged integrated circuits (820) includes: at least one packaged integrated circuit (820); a radio frequency, RF, socket (700) configured to receive the at least one packaged integrated circuit (820) and facilitate routing RF signals thereto via at least one input connector and at least one output connector; and at least one interface configured to couple a tester to at least one packaged integrated circuit (820). The RF socket (700) includes a mmW absorber (1010) located adjacent the at least one output connector of the RF socket (700).

20 Claims, 4 Drawing Sheets

(56) References Cited

U.S. PATENT DOCUMENTS

2015/0369840 A1    12/2015  Treibergs et al.

OTHER PUBLICATIONS

"MicroLink Contactor—Elite Electrical Performance for Analog, Mixed Signal, and RF Test", Multitest, downloaded Mar. 21, 2016.
"Silmat Contact Systems", Phoenix Test Arrays, High Performance Contacts, downloaded Mar. 21, 2016.

* cited by examiner

ATE TESTING SYSTEM AND METHOD FOR MILLIMETRE WAVE PACKAGED INTEGRATED CIRCUITS

CROSS-REFERENCE TO RELATED APPLICATIONS

This application claims the priority under 35 U.S.C. § 119 of European Patent application no. 17159572.1, filed on 7 Mar. 2017, the contents of which are incorporated by reference herein.

FIELD OF THE INVENTION

The field of the invention relates to an automatic testing equipment (ATE) testing system and method for millimetre wave (mmW) packaged integrated circuits. The invention is applicable to, but not limited to, a mmW testing system providing a low cost and high performance testing of packaged mmW multiple radio frequency (RF) devices or circuits.

BACKGROUND OF THE INVENTION

A majority of the current millimetre wave (mmW) radar units are constructed using mmW integrated circuits (ICs) that include multi-channel transceivers (TRX) that are operable across a number of frequency channels. The mmW ICs also include other high frequency devices, such as, mixers, low noise amplifiers (LNAs). MmW ICs are also used in very-high frequency communication systems, such as $5^{th}$ generation communication operational in a 55-65 GHz range. In the automotive radar field, the supported frequencies are 76-81 GHz. FIG. 1 illustrates a simplified diagram of a known integrated radio frequency (RF) multi-channel transceiver (TRX) 100 that is available as a packaged System on Chip (SOC) 102 at mmW frequencies for radar applications. The SOC 102 includes a number of receiver circuits 112 coupled to a series of receiver antennas 104-106. The SOC 102 also includes a number of transmitter circuits 114 coupled to a series of receiver antennas 108-110. Suitable packages for mmW ICs are for example Wafer Level Chip Scale Packages (WLCSP), Quad-flat no-leads (QFN), etc.

Referring now to FIG. 2, a simplified diagram of a known ball grid array (BGA) packaged chip 200 is illustrated. The BGA packaged chip 200 includes a plastic mould 202 to protect the electronics of the integrated circuit (chip) 204. A BGA is a type of surface-mount packaging (a chip carrier) used for integrated circuits. BGA packages are used to permanently mount devices, such as microprocessors or radio frequency (RF) components. A BGA can provide more interconnection pins than can be typically put on a dual in-line or flat package. The chip 204 is connected to a printed circuit board ((PCB) not shown) via solder balls 206, which are typically in a form of a BGA. Some components of the chip 204 are electrically connected 208, 210 to one or more of the solder balls 206, via a dielectric 212 (that is a part of the package), to transfer signals to the PCB.

The testing of mmW ICs, circuits and devices requires the testing of RF critical parameters, such as phase noise. High volume production testing of packaged ICs, such as the BGA packaged chip 200 of FIG. 2 is performed on automatic test equipment (ATE). An ATE tester typically measures DC voltages of packaged mmW ICs, circuits and devices and is unable to measure RF parameters, such as transmit output power or noise figure (NF) of a receiver direct, due to cost and complexity in the measuring of this performance criterion at these high frequencies.

Typically, RF performances of packaged mmW ICs, circuits and devices are determined by testing the chips using a known RF built-in set test (RF-BIST) 300, as illustrated in FIG. 3. The RF-GIST 300 is shown for a transmitter circuit 114 of FIG. 1 that is coupled a transmit antenna 108. The transmit circuit 114 includes an output power amplifier (PA) 302 that is arranged to receive a test signal 301. The output from the PA is applied to an internal power detector, such as voltage (or power) detector 304, coupled to a voltage measurement function 306, which samples the voltage of the signal output from PA 302. The RF-BIST results are then correlated with RF measurements previously conducted using high performance test equipment performed in the laboratory. The result of the voltage detector 304 is a voltage that can then be correlated to the absolute output power previously measured with high accuracy equipment in the laboratory.

For cost and ball planarity reasons, sockets with spring loaded (POGO) contacting pins are typically used as a contactor between the package and the load board PCB of the ATE. An example of a known ATE testing arrangement 400 using a non-planar package in a socket with POGO contacting pins, is illustrated in FIG. 4. The known ATE testing arrangement 400 includes a chip package 200 with solder balls 206 that are electrically connectable to spring-loaded contacts 416 of respective POGO pin sockets 408. The POGO pin sockets 408 are contained within a socket body 410 and electrically connected to a PCB 414 via respective electrically-conducting pads 412.

At mmW frequencies, standard ATE-sockets, such as spring-loaded POGO pin sockets 408 suffer from mismatches at the RF inputs/outputs. Mismatch leads to inaccurate correlation with the laboratory measured RF results, due to the degradation of the perceived chip performance, i.e. resulting in a higher or lower voltage reading of the voltage (or power) detector 304 in FIG. 3. Compared to the wavelength at mmW frequencies, standard spring-loaded pin contacts 416 are too long (at >1 mm). These long pins introduce high resistances and therefore introduce undesirable inductances. This may also result in inaccurate measurements in a broadband ATE measurement set up, e.g. if the mmW ICs, circuits and devices are designed to operate over a 5 GHz bandwidth from 76 to 81 GHz (as in a typical automotive radar application). In essence, it is not possible to match the output of the chip package 200 if there is more than $\lambda/4$ transmission line in between the chip package and the measurement device. Thus, incorrect matching at the output lowers the very-high frequency performance, which results in potentially false fails during ATE testing.

Customized high performance sockets, with very good matching and low losses, are sometimes employed for testing purposes and use matched traces for the RF-contacts, i.e. very tightly-controlled 76 to 81 GHz transmission lines with matched connectors. However, the matching structure is required to be customized for each chip package 200, which leads to high costs. Furthermore, these sockets are only suitable for validation and special RF-testers and are, thus, only used for low volume testing.

When testing using an RF-BIST, mmW sockets having 1 mm-wave coaxial connectors are typically employed between the measurement test equipment and the spring-loaded POGO pin sockets. Furthermore, the overall testing unit is usually integrated in a Faraday cage (with an RF shield) for protection, i.e. an enclosure used to block electromagnetic fields. Such RF shields are not employed in a RF-BIST ATE solution, as their bulk and sensitivity to mechanical stress means that they are unsuitable for use in a production environment. Additionally, these sockets do not allow multiple RF transceiver testing stations within an ATE.

Additionally, the use of 'standard' sockets for mmW applications are only specified up to 40 GHz i.e. Phoenix test array C300 or C200. Such known test arrays consist of a shield to protect the socket contacts and an elastomer that conducts RF signals after package chip insertion. When using these 'standard' sockets on a PCB board, the elastomer (dielectric part) overlaps the mm-wave traces on the PCB. This overlap leads to a reduction of the impedance of mm-wave trace and, therefore, higher losses.

Finally, on ATEs, RF inputs and RF outputs of the transmitters and receivers have to be terminated accurately in order to avoid RF signal reflections. However, a standard ATE acts as an unmatched load at mmW frequencies, so is typically unsuitable for use when accurate matching is needed. The ATE's RF inputs and RF outputs also need to be isolated to avoid cross talk between the transceiver-channels (TX to TX, TX to RX), as well as between transceiver to transceiver in a case of a multiple RF transceiver testing station tester. Also, tests that are sensitive to cross talk cannot be executed concurrently in parallel, thereby requiring sequential testing that increases the overall test time in a production environment.

Thus, there exists a need for an improved testing set up for mmW chip packages.

SUMMARY OF THE INVENTION

The present invention provides a testing system and a method for testing a millimetre wave (mmW) packaged integrated circuit, as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Figure 1:
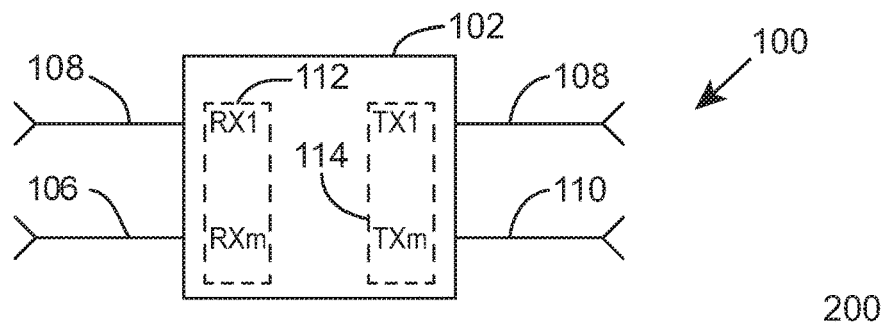
FIG. 1 illustrates a simplified diagram of a known integrated multi-channel transceiver.
Figure 2:
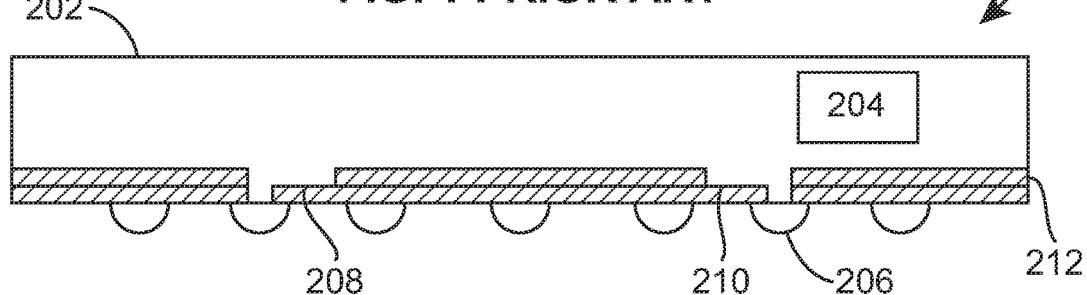
FIG. 2 illustrates a simplified diagram of a known BGA packaged chip.
Figure 3:
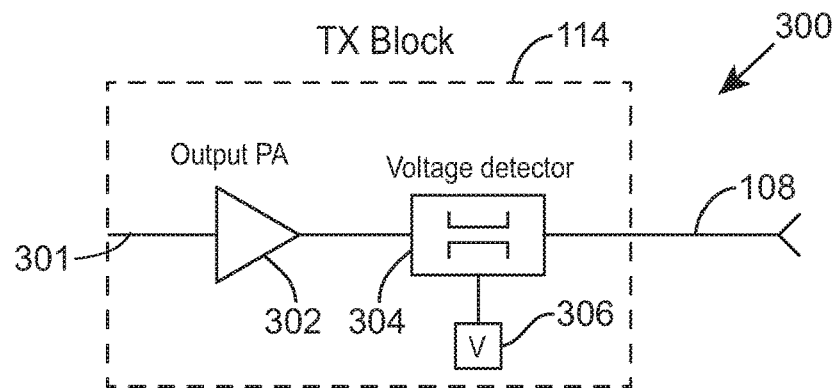
FIG. 3 illustrates a known RF-BIST test arrangement.
Figure 4:
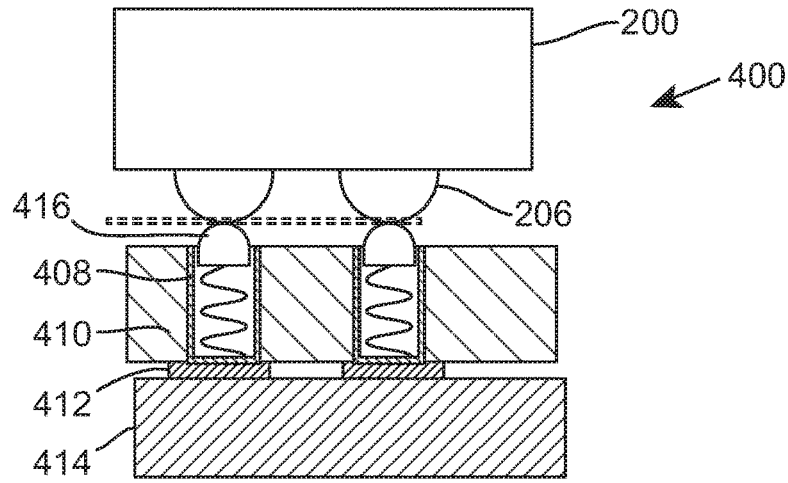
FIG. 4 illustrates a known ATE testing arrangement using a non-planar packaged chip in a socket with POGO contacting pins.

Examples of the invention are described with reference to improving a matching and isolation of a testing system by using a mmW absorber at the output of an RE socket on the testing system. In some examples, the mmW absorber may be used to achieve a termination and isolation between input-output ports of, say, 15 dB or better, and preferably >30 dB. A suitable range of values for the termination and isolation between input-output ports is application-dependent, but in general a higher range of values is better. In some examples, the absorber may provide a termination such that a signal reflection equals zero at its input, thereby meaning that the complete signal wave is perfectly transmitted. In this manner, the absorber absorbs the transmitted wave, such there is no reflection to the input and the input sees a termination.

In some examples, the use of a mmW absorber at the output of the RE socket may also facilitate concurrent multiple mmW ICs, circuits, devices, or RE transceiver testing within an ATE supporting multiple RE TRX IC testing by reducing or eliminating the known effects of cross coupling between mmW ICs, circuits, devices, or RE transceiver testing stations. It is also envisaged that in other examples of the invention different absorbing materials may be used than those illustrated herein, such as low cost thin mmW absorber sheets. Examples of the invention are described with reference to operating in the Automotive Radar frequency band of 76 GHz to 81 GHz range. However, it is envisaged, that in other examples the circuits and concepts herein described may be equally applied to any mmW testing system and any very-high operating frequency, for example where the testing system may ordinarily suffer from or be affected by matching and/or isolation problems of the packaged RF IC under test.

Examples of the invention are also described with reference to modifying a standard RE socket for at least one packaged integrated circuit, such as a packaged RE TRX IC. In some examples the standard RE socket is modified by introducing cut-out areas in a flexible contact, such as an elastomer. In some examples the standard RE socket is modified by introducing cut-out areas in the shield, typically located adjacent RF signal carrying pins. In this manner the cut-out areas are made as close as possible to RE pins of the packaged RE TRX IC to reduce losses and facilitate PCB matching. Although examples of the invention are described with reference to introducing substantially rectangular-shaped cut-out areas, it is envisaged that in other examples non-rectangular cut-out shaped areas may be employed. It is also envisaged that in other examples of the invention the cut-out areas may be of a different size and/or depth and/or width to the illustrated examples.

Examples of the invention are also described with reference to a use of a modified standard RE-socket. In some examples, a standard ATE tester is used to make use of the RE-BIST concept. Thus, and notably, in some examples, the same socket and associated testing board is used in both the laboratory validation measurements and the ATE. In this manner, a better correlation for ATE measurements (of DC values) vis-à-vis the laboratory validation measurements (of RF parameters) can be achieved by using the same testing setup, to verify the RE-BIST concept. In this context, in some examples, the laboratory validation board is modified to feature the same matching structures as found on the mmW PCB. Additionally, the load board of the ATE is made of the same mmW PCB material as the laboratory validation board, to further improve the correlation for ATE measurements (of DC-values) vis-à-vis the laboratory validation measurements (of RF parameters). In this regard, comparable results and higher accuracy can be achieved when correlating the ATE measurements with those measurements from the laboratory. If, for example, the load board is made on completely different material or the mmW traces have different widths from the laboratory validation board, and thus the mmW outputs would (in tests that do not use the concepts described herein) see a different load, which would lead to different results or lower accuracy.

In this regard, a laboratory test delivers both RF results and DC results that are performed under the condition that the mmW ports are correctly terminated. Thus, by terminating the ATE tester using an absorber, the ATE is able to deliver correctly terminated DC-results (albeit only DC-results). With the same termination, both sets of DC-results (i.e. from the laboratory and the ATE) may be compared/correlated. Thereafter, in a case that can use only ATE measurements, but with a correctly terminated ATE, and preferably using the same test set-up (e.g. isolated mmW traces) and materials and testing conditions in accordance with example embodiments of the invention, the measured ATE DC results may be correlated with the laboratory DC results and the corresponding related RF parameters extrapolated therefrom.

In a first aspect of the invention, an automatic testing equipment (ATE) testing system for millimetre wave (mmW) packaged integrated circuits is described. The ATE testing system includes: at least one packaged integrated circuit; a radio frequency, RF, socket configured to receive the at least one packaged integrated circuit and facilitate routing of RF signals thereto via at least one input connector and at least one output connector; and at least one interface configured to couple a tester to the at least one packaged integrated circuit. The RF socket includes a mmW absorber located adjacent the at least one output connector of the RF socket. The absorber is placed on the mmW trace next/adjacent to the RF socket. In theory, in some examples, there is no longer a need to have a contact to the socket. Placing the absorber very close to the socket achieves better matching and better isolation. Also space can be saved. In this manner, the use of a mmW absorber located adjacent the at least one output connector of the RF socket may improve a matching of test equipment to the at least one packaged integrated circuit. The use of an absorber may also act as a good termination of radiated signals at RF frequencies, thereby improving isolation between respective output pins of the at least one packaged integrated circuit of a testing system.

In some examples, the mmW absorber may be located adjacent the at least one output connector of the RF socket and may be configured to provide a termination and isolation between a plurality of output connectors of >30 dB.

In some examples, the testing system may include a multiple mmW ICs, circuits, devices, or RF transceiver testing station load board for receiving a plurality of packaged integrated circuits for individual and respective testing and the mmW absorber located adjacent the at least one output connector of the RF socket is configured to reduce cross coupling between multiple mmW ICs, circuits, devices, or RF transceiver testing stations. In some examples, the mmW absorber located adjacent the at least one output connector of the RF socket may be configured to reduce cross coupling between input or output connectors from multiple mmW ICs, circuits, devices, or RF transceiver testing stations, such that the concurrent testing of the multiple packaged integrated circuits may be performed.

In a second aspect of the invention, a testing system for millimetre wave (mmW) packaged integrated circuits is described. The testing system includes: at least one packaged integrated circuit; a radio frequency, RF, socket configured to receive the at least one packaged integrated circuit and facilitate routing RF signals thereto via at least one input connector and at least one output connector; and at least one interface configured to couple a tester to at least one packaged integrated circuit. The RF socket includes a supporting material dielectric, such as an elastomer, connected to a shield and the shield comprises at least one extended contiguous cut-out area located adjacent RF signal carrying pins and revealing more than one RF signal carrying pin. The use of at least one extended contiguous cut-out area located adjacent RF signal carrying pins may reduce the losses in the testing system and enable better PCB matching.

In some examples, the socket may include a supporting material dielectric, such as an elastomer, connected to the shield and the elastomer may also include at least one cut-out area, which may also reduce the losses in the testing system and enable better PCB matching. PCB matching become easier because an overlapped mm-wave trace has an unknown impedance (because of the unknown dielectric properties of the elastomer at 80 GHz), unless a characterization of the elastomer at these frequencies is performed. This characterization requires a lot of work and can, thus, only be supported by data provided by the supplier.

In some examples of the second aspect, the testing system may be an automatic test equipment, ATE, testing system configured such that the same socket and associated testing board may be used in both laboratory measurements and in the ATE testing system. In some examples, the testing system may be a RF built-in set test. In some examples, the testing system may be configured to test mmW packaged integrated circuits that may include mmW ICs, circuits, devices, or radar RF transceivers in a $5^{th}$ generation (5G) communication range of around 60 GHz or an automotive 76-81 GHz range.

Because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 5:
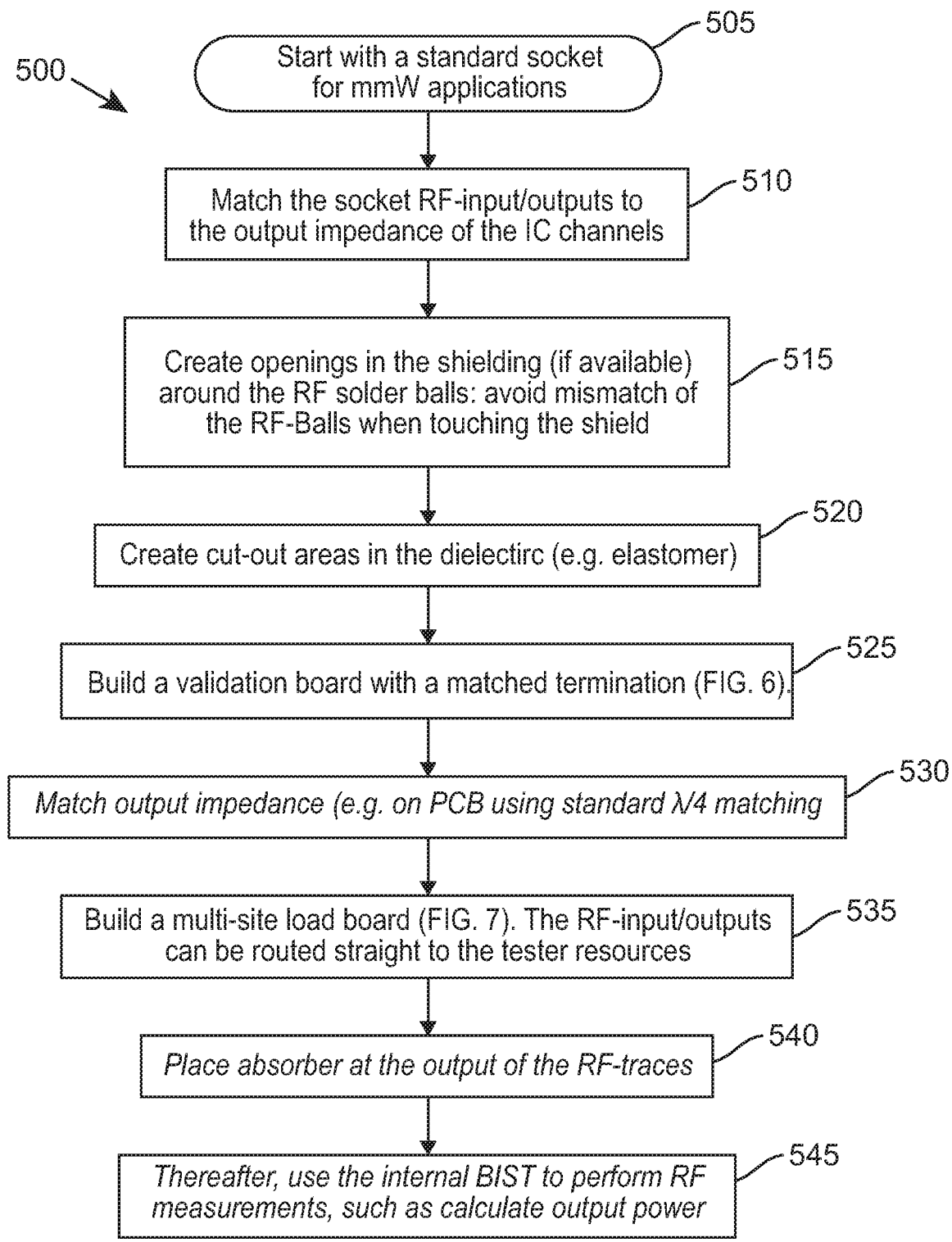
FIG. 5 illustrates an example flowchart for constructing a testing system for millimetre wave (mmW) packaged integrated circuits, according to example embodiments of the invention.

Referring now to FIG. 5, an example flowchart 500 for constructing a testing system for millimetre wave (mmW) packaged integrated circuits (ICs) is illustrated, according to example embodiments of the invention. At 505, the flowchart 500 commences with a standard socket for mmW applications being available, e.g. using a Phoenix test array. At 510, the socket RF inputs/outputs are matched to the output impedance of the packaged IC ports.

In one example, the matching is achieved by modifying the standard socket, together with a post matching of a validation board in the laboratory. In some examples described herein, the terminology describes a 'validation board' that is used in the lab and a 'load board' that is used in an ATE tester. However, as described above and in some preferred embodiments, the mmW tester design benefits from using a substrate that is identical for both validation and load board.

In this example, the modifications include, at 515, creating openings in the package shielding around the RF solder balls. In one first example, the openings are created to avoid mismatch of the RF-Balls when touching the package shielding. In one example, this may be achieved using a package dielectric, which is lossy at mmW frequencies. In a second example, at 520, cut-out areas are created in the socket dielectric (e.g. elastomer). In this example, the cut-out areas are created for two reasons: first, the cut-out areas are created as close as possible to RF-pins (such that any overlap area (that would detune its impedance) $\lambda/4$), which reduces the losses and enables a PCB matching: and secondly, placing absorber materials as close as possible to the RF Pins leads to a better matching and avoids cross coupling. In this manner, the cut outs enable a reduction in the overlap and reduction in the impedance detuning.

Figure 6:
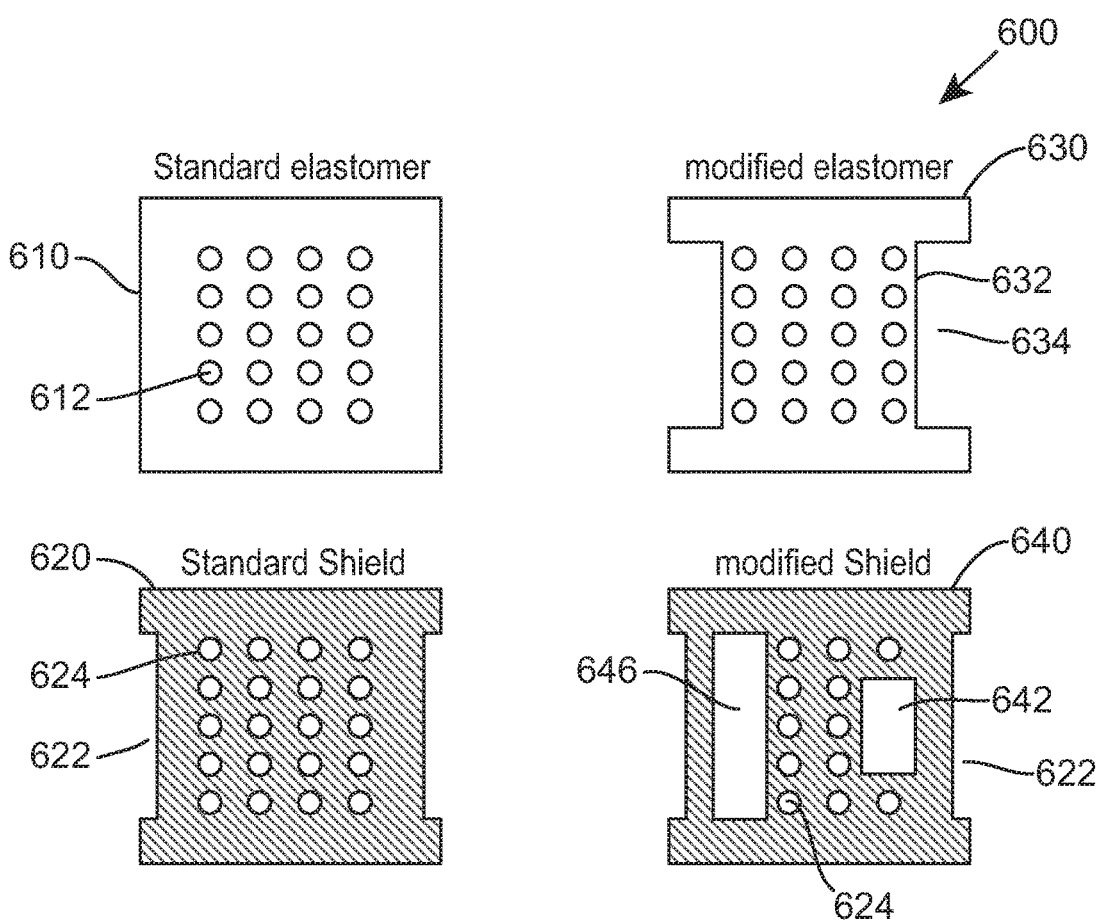
FIG. 6 illustrates an example of a modified socket construction for a validation board, according to example embodiments of the invention.
Figure 10:
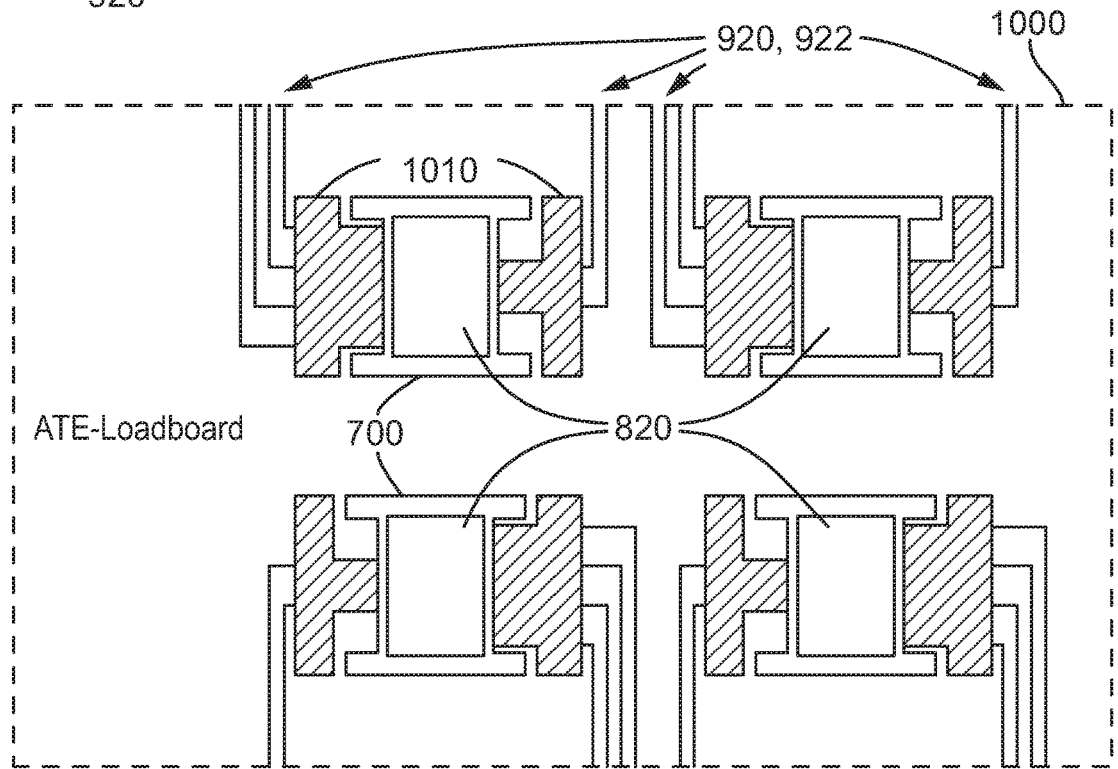
FIG. 10 illustrates an example of a top view of a multiple RF transceiver testing station (quad-RF transceiver testing station in this example) ATE load board modified in a testing system, according to an example embodiment of the invention.

At 525, a validation board is built with a matched termination (as illustrated in FIG. 6), to allow measurement of one or more 'real' parameters. This measurement of one or more 'real' parameters is important in the correlation RF to DC results. In one example, the transition to/from the validation board may be made with, say, 1 mm-coaxial cable, a waveguide transition or mmW structures for PCB probing. At 530, the matching of the output impedance may be achieved by a post matching process on the PCB, for example using standard matching techniques i.e. $\lambda/4$ matching. At 535, in this example, a multiple RF transceiver testing station load board is built (for example as illustrated in FIG. 10). In this example, the RF inputs/outputs may be routed straight to the tester resources. In known testers, where there is no absorber, the tester resources simulate high ohmic loads (in that they only measure voltage), which will effectively cause a mismatch of the RF inputs/RF outputs. In contrast, in examples of the invention and by placing the absorber adjacent the RF socket, the RF sockets/ports become matched. Thereafter, any load can be connected. In accordance with example embodiments, the tester resources still test DC signals on the RF transmission lines, such as a solder ball break detector (e.g. current).

At 540, according to examples of the invention, an RF absorber is placed at the output of the RF-traces. In this manner, the absorber may absorb the output power, so that the transmitters and receivers see matched outputs, and any cross-coupling there between, is reduced. Thus, the absorber may be selected and configured to function as a good termination for the preceding RF circuits/components. Furthermore, in this manner, the absorber may be selected and configured to provide isolation between the input-output ports and other RF-signals, which can interfere with the test signals. Additionally, in this manner, the absorber may be selected and configured to enable open-short measurements with the ATE.

Since, in some examples, the absorber is placed above the RF transmission line, this transmission line should be not cut or interrupted, as they are connected to the tester resources (and can be seen as DC-lines). Thus, they may still be used for open circuit-short circuit tests, since they are conductive, Open circuit-short circuit tests facilitate detecting, if the chip's connections are shorted or are not connected (e.g. as an open/short test). To perform this measurement, all chip contacts have to be DC-connected to the tester resource.

The use of an absorber may also avoid cross coupling between multiple RF transceiver testing stations in ATE load board configurations. Thereafter, at 545, the internal BIST may be used to perform DC measurements in an ATE and then convert the measured DC values to a RF power level using a correlation factor obtained from the laboratory measurements, thereby resulting in equivalent RF measurements, such as calculating output power. In some examples, the absorber may be a standard sheet absorber at the desired operating frequency (i.e. eccosorb™), or a foam absorber mounted on PCB. The losses of such a standard absorber are typically higher than 20 dB, which is sufficient for the purpose of the aforementioned examples.

In accordance with example embodiments, and referring now to FIG. 6, an example of a modified socket construction 600 for a validation board is illustrated. A known standard elastomer configuration 610 with electrical contacts 612 is illustrated, together with the known standard shield configuration 620, with holes 624 for locating over the corresponding electrical contacts 612 of the known standard elastomer configuration 610. Additionally, the known standard shield configuration 620 includes a cut-out area 622 on either side of the shield 620 to enable RF input and RF output connections to carry signals to/from a packaged IC located on the shield.

In accordance with some example embodiments, the example of a modified socket construction 600 for a validation board also illustrates a modified flexible dielectric with flexible contact (which in some examples may encompass a conductive rubber configuration), such as an elastomer configuration 630 with electrical contacts 632 and a relatively large elastomer cut-out area 634, located in the regions where RE input and RF output connections may be coupled. The modified socket construction 600 also includes a modified shield configuration 640, with a first portion of the existing holes 624 for locating over the corresponding electrical contacts 632 of the modified elastomer configuration 630. Additionally, the modified shield configuration 640 includes at least one second portion of the standard holes being modified to include cut-out areas 642, 646, for example to enable RF input and RF output connections to carry signals to/from the package. These cut-out areas 642, 646 are independent from the RF pins/RF transmission lines. In some examples, the cut-out areas on the elastomer may be made in the overlap area between the RF transmission line on the PCB and the elastomer. The cut-out areas on the modified shield 640 are made in the area where the RE solder balls are, on order to avoid RE solder ball-to-modified shield 640 contact. Both modified shield 640 and elastomer present a lossy dielectric to the mm/RF waves.

In this example, the cut-out areas 634 are created in the socket dielectric (e.g. elastomer). as close as possible to RF-pins (such that any overlap area (that would detune its impedance)<$\lambda/4$ transmission line). In this manner, losses are reduced and the modified socket construction 600 enables better PCB matching, by reducing the impedance detuning.

Figure 7:
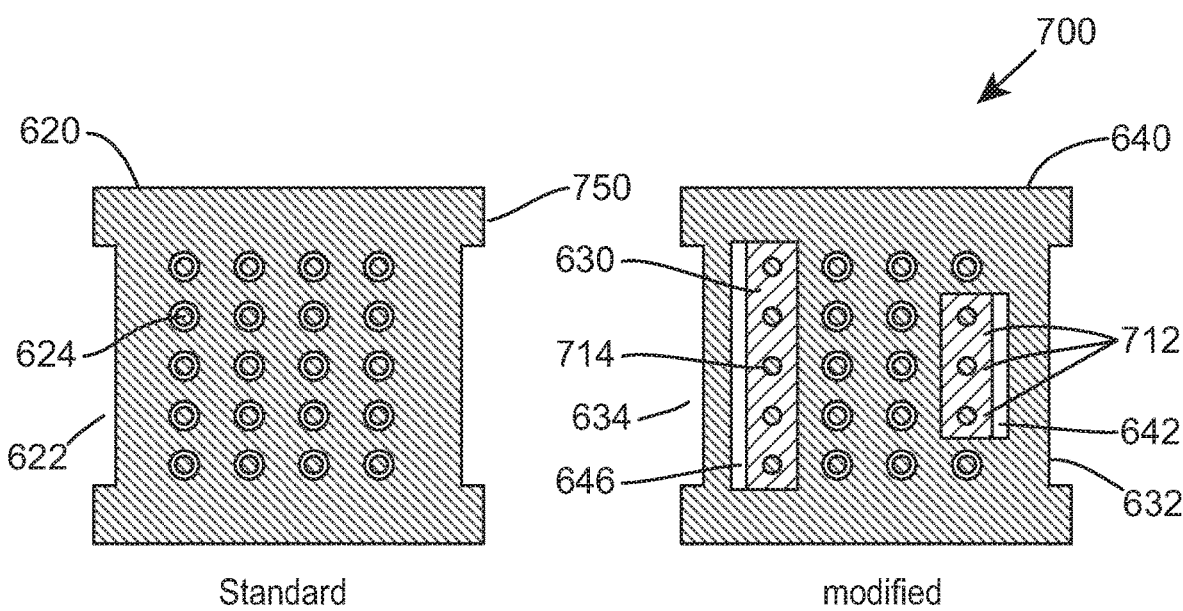
FIG. 7 illustrates an example assembled modified socket construction for a validation board, according to example embodiments of the invention.

Referring now to FIG. 7, an example assembled modified socket construction 700 is illustrated for a validation board, according to example embodiments of the invention. FIG. 7 illustrates a known assembled standard elastomer and shield configuration 750 with electrical contacts 612 accessible through holes in the standard shield configuration 620, and cut-out areas 622 on either side of the shield 620 to enable RF input and RF output connections to carry signals to/from the packaged IC located on the shield.

In accordance with example embodiments, the modified socket construction 700 is formed by combining the respective modified elastomer 630 and modified shield 640 parts of FIG. 6. Thus, the example assembled modified socket construction 700 illustrates the modified elastomer configuration 630 with electrical contacts 632 and a relatively large elastomer cut-out area 634. The assembled modified socket construction 700 also includes the modified shield configuration 640, with the at least one second portion of the standard holes being modified to include additional cut-out areas 642, 646, for example to enable better access for RE input and RE output connections 712, 714 to carry RE signals to/from the package.

Figure 8:
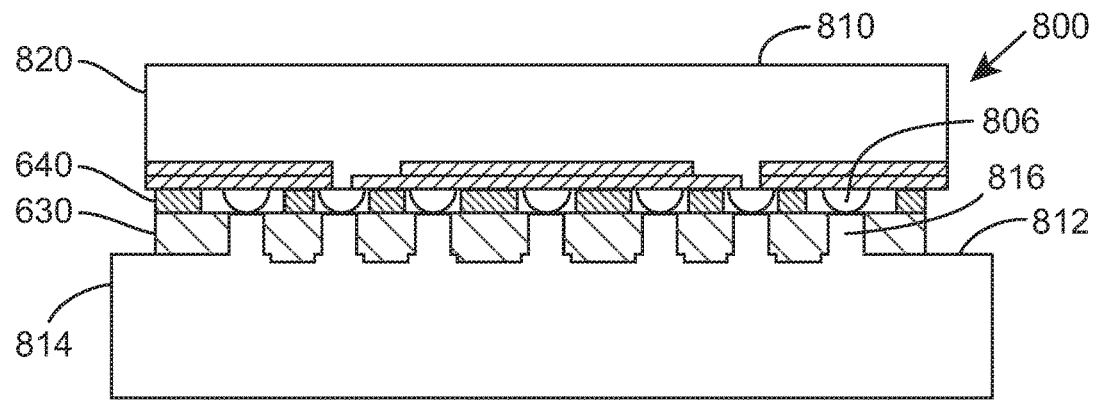
FIG. 8 illustrates an example of a mounted packaged RF TRX IC in a modified socket construction, according to an example embodiment of the invention.

Referring now to FIG. 8, an example of a mounted packaged RE TRX IC in a modified socket construction 800 is illustrated, according to an example embodiment of the invention. The mounted packaged RF TRX IC 820 in a modified socket construction 800 includes some components of the packaged RF TRX IC (chip) 820 being electrically connected 810 to one or more of the solder balls 806 to transfer signals to the RF PCB 814. These signals are passed via socket contacts 816 to the transmission lines located atop the packaged RF TRX IC 820. The modified socket construction 800 includes the modified shield 640 and modified elastomer 630, as illustrated in FIG. 6 and FIG. 7.

Figure 9:
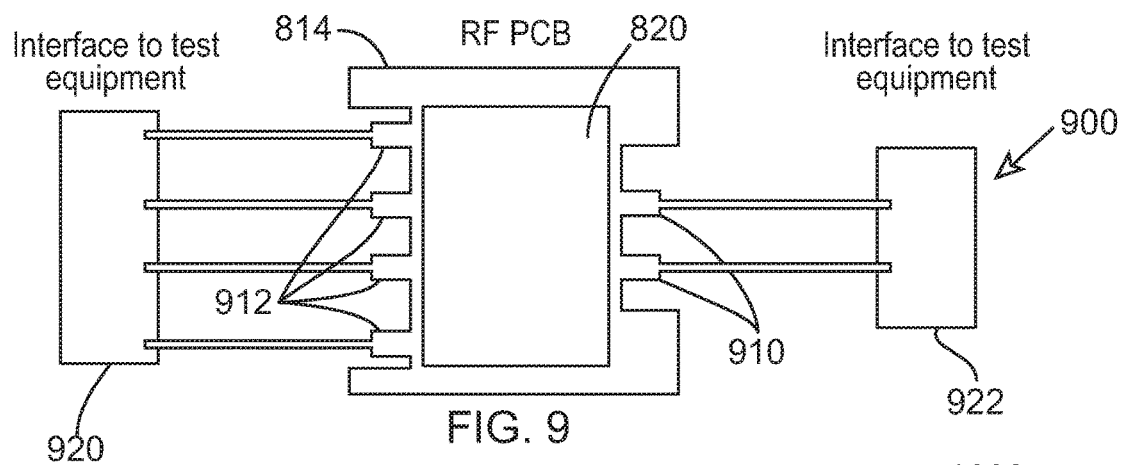
FIG. 9 illustrates an example of a top view of a modified validation board in a testing system, according to an example embodiment of the invention.

Referring now to FIG. 9 an example of a top view of a modified validation board in a testing system 900 is illustrated, according to an example embodiment of the invention. The testing system 900 includes interfaces 920, 922 to connect the modified validation board to test equipment (not shown). The modified validation board includes the mounted packaged RF TRX IC 820 located atop the RF PCB 814, with the modified shield 640 and modified elastomer 630 being located there between. The testing system 900 also includes matching networks 910, 912 connected to the RF input and RF output connections that carry RF signals to/from the packaged RF TRX IC 820.

Referring now to FIG. 10, an example of a top view of a multiple mmW ICs, circuits, devices, or RF transceiver testing station (which in this example is described as a quad RF transceiver testing station in this example) ATE load board 1000 in a testing system is illustrated, according to an example embodiment of the invention. The example of a top view of, say, a multiple RF transceiver testing station ATE load board 1000 in a testing system includes interfaces 920, 922 to connect each of the four ATE load boards to test equipment (not shown). The multiple RF transceiver testing station ATE load board 1000 board includes four mounted packaged RF TRX ICs 820 located atop respective RF PCB, with the modified socket construction 700 that includes the modified shield and modified elastomer being located there between. The multiple RF transceiver testing station ATE load board 1000 also includes absorbers 1010 located at the outputs of the RF-transmission line traces, thereby acting as a good termination of the RF input-output ports. Furthermore, the absorber provides isolation between the respective input-output ports within and between the packaged RF TRX ICs 820. In this manner, the absorbers 1010 avoids cross coupling between RF transceiver testing stations in the ATE load board 1000. In some examples, the absorbers 1010 may be implemented using a standard sheet absorber at the desired operating frequency (e.g. eccosorb™) or they may be implemented using a foam absorber mounted on the respective RF PCBs. Although this example illustrates a quad RF TRX IC ATE load board, it is envisaged that in other examples, any number of a plurality of testing packaged ICs cane be supported.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. The connections as discussed herein may be any type of connection suitable to transfer RF or dc signals from or to the respective nodes, units or devices or packages or transmission lines, for example via intermediate elements, such as BGAs. Accordingly, unless implied or stated otherwise, the connections may for example be direct connections or indirect connections. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality. Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Also for example, in one embodiment, the illustrated examples may be implemented as circuitry located on a single integrated circuit or within a same device. Alternatively, the circuit and/or component examples may be implemented as any number of separate integrated circuits or separate devices interconnected with each other in a suitable manner. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An automatic testing equipment (ATE) system for millimeter wave (mmW) packaged integrated circuits comprises:
 a packaged integrated circuit;
 a radio frequency (RF) socket configured to receive the packaged integrated circuit and facilitate routing RF signals thereto via at an input connector and an output connector; and
 an interface configured to couple a tester to the packaged integrated circuit,
 wherein the RF socket includes a mmW absorber located adjacent the output connector of the RF socket to provide isolation between respective input-output ports within and between the packaged integrated circuit.

2. The ATE testing system of claim 1, wherein the testing system comprises:
 a multiple RF transceiver testing station load board configured to receive a plurality of packaged integrated circuits for testing; and
 the mmW absorber located adjacent the output connector of the RF socket is configured to reduce cross coupling between the multiple RF transceiver testing stations.

3. The ATE testing system of claim 2, wherein the mmW absorber located adjacent the output connector of the RF socket is configured to reduce cross coupling between input or output connectors from the multiple RF transceiver testing stations.

4. The ATE testing system of claim 1, wherein the RF socket comprises:
 a flexible contact connected to a shield, wherein and the shield comprises at least one extended contiguous cut-out area located adjacent RF signal carrying pins and revealing more than one RF signal carrying pin.

5. The ATE testing system of claim 1, wherein the mmW absorber located adjacent the output connector of the RF socket is configured to provide a termination and isolation between a plurality of output connectors in a region greater than 15 dB.

6. A testing system for millimeter wave (mmW) packaged integrated circuits comprises:
 a packaged integrated circuit;
 a radio frequency (RF) socket configured to receive the packaged integrated circuit and facilitate routing RF signals thereto via an input connector and an output connector; and
 an interface configured to couple a tester to the packaged integrated circuit,
 wherein the RF socket comprises a shield comprising a hole for locating over a corresponding RF signal carrying pin and an extended contiguous cut-out area located adjacent RF signal carrying pins and revealing more than one RF signal carrying pin to provide isolation between respective input-output ports within and between the packaged integrated circuit.

7. The testing system of claim 6, wherein the RF socket comprises:
 a flexible dielectric comprising a flexible contact connected to a shield, the flexible contact comprising a cut-out area.

8. The testing system of claim 6, wherein the testing system is configured to support the same RF socket and associated testing board in laboratory measurements and an automatic test equipment (ATE).

9. The testing system of claim 6, wherein the testing system comprises an RF built-in set test.

10. The testing system of claim 6, wherein the mmW packaged integrated circuits comprises one or more from a group of: a mixer, a low noise amplifier (LNA), a fifth generation communication integrated circuit operational in a 55-65 GHz range, or a radar RF transceivers operational in a 76-81 GHz range.

11. The testing system of claim 6, wherein the mmW packaged integrated circuit is tested in an automatic test equipment (ATE) or a mmW tester.

12. A method for testing a millimeter wave (mmW) packaged integrated circuit (IC) connectable to a radio frequency (RF) socket, the method comprising:
 matching an RF socket input connector or an RF socket output connector to an output impedance of the mmW packaged IC;
 constructing a validation board with a matched termination; and
 incorporating an interface for connecting the RF socket input connector or the RF socket output connector to a test equipment,
 wherein the matching comprises creating a hole for locating over a corresponding RF signal carrying pin and creating an extended contiguous cut-out area in a shielding connected to the mmW packaged IC located adjacent RF signal carrying pins and revealing more than one RF signal carrying pin,
 wherein the RF socket includes a mmW absorber located adjacent the output connector of the RF socket to provide isolation between respective input-output ports within and between the packaged IC.

13. The method of claim 12, wherein the matching further comprises:
 creating a cut-out area in an RF socket flexible contact connected to the shielding.

14. The method of claim 12, further comprising:
 locating a mmW absorber adjacent an output connector of the RF socket.

15. The method of claim 14, further comprising:
 constructing a multiple RF transceiver testing station load board,
 wherein the mmW absorber located adjacent the output connector of the RF socket is configured to reduce cross coupling between input or output connectors of the multiple RF transceiver testing station.

16. The method of claim 12, wherein RF socket comprises a flexible dielectric with a flexible contact connected to the shielding.

17. The method of claim 12, wherein the mmW packaged IC comprises one or more mixers, one or more low noise amplifiers, one or more fifth generation communication integrated circuits operational in a 55-65 GHz range, or one or more radar RF transceivers operational in a 76-81 GHz range, or any combination thereof.

18. The method of claim 12, wherein the mmW packaged IC is tested in an automatic test equipment (ATE) or a mmW tester.

19. The method of claim 14, wherein the mmW absorber is configured to provide a termination and isolation between a plurality of output connectors in a region greater than 15 dB.

20. The method of claim 15, wherein the mmW absorber is configured to reduce cross coupling between input or output connectors from multiple RF transceiver testing stations.

* * * * *